United States Patent
Festag et al.

(10) Patent No.: US 6,540,555 B1
(45) Date of Patent: Apr. 1, 2003

(54) SHIELDING PLATE, IN PARTICULAR FOR OPTOELECTRONIC TRANSCEIVERS

(75) Inventors: Mario Festag, Berlin (DE); Uwe Fischer, Berlin (DE); Michael Pöhnke, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/699,322

(22) Filed: Oct. 30, 2000

Related U.S. Application Data

(63) Continuation of application No. PCT/DE00/02747, filed on Aug. 10, 2000.

(51) Int. Cl.[7] .............................................. H01R 13/648
(52) U.S. Cl. ....................................... 439/607; 439/939
(58) Field of Search ............................... 439/607, 609, 439/939, 610

(56) References Cited

U.S. PATENT DOCUMENTS

| | | | |
|---|---|---|---|
| 4,812,137 A | 3/1989 | Wilson et al. | |
| 5,171,161 A | * 12/1992 | Kachlic | ...................... 439/607 |
| 5,755,595 A | 5/1998 | Davis et al. | |
| 5,766,041 A | 6/1998 | Morin et al. | |
| 5,989,069 A | * 11/1999 | Tan | .............................. 439/607 |
| 6,066,001 A | 5/2000 | Liptak et al. | |
| 6,179,627 B1 | * 1/2001 | Daly et al. | ................... 439/607 |

FOREIGN PATENT DOCUMENTS

| | | |
|---|---|---|
| EP | 0 437 931 A2 | 7/1991 |
| EP | 0 822 623 A1 | 2/1998 |
| EP | 1 011 176 A1 | 6/2000 |
| EP | 1 026 785 A2 | 8/2000 |
| WO | WO 00/13054 | 3/2000 |

* cited by examiner

*Primary Examiner*—Lynn D. Feild
*Assistant Examiner*—Phuong K Dinh
(74) *Attorney, Agent, or Firm*—Laurence A. Greenberg; Werner H. Stemer; Gregory L. Mayback

(57) ABSTRACT

The shielding plate is particularly suited for optoelectronic transceivers. The shielding plate is a hollow body in the form of a casing and has contact springs which are formed on the hollow body in order to make contact between the hollow body and a metallic structure. Contact springs are formed by projections which are arranged on the end face of the hollow body and are bent back onto the hollow body. As a result, the shielding plate having a chimney-like structure with improved shielding and reduced emission.

14 Claims, 3 Drawing Sheets

SHIELDING PLATE, IN PARTICULAR FOR OPTOELECTRONIC TRANSCEIVERS

CROSS-REFERENCE TO RELATED APPLICATION

This is a continuation of copending international application PCT/DE00/02747, which was filed on Aug. 10, 2000, and which designated the United States.

BACKGROUND OF THE INVENTION

Field of the Invention

The invention relates to a shielding plate that is suitable, in particular, for optoelectronic transceivers and for optical connecting elements coupled to them. The shielding plate has a hollow body in the form of a casing and contact springs which are formed on the hollow body in order to make contact between the hollow body and a metallic structure.

It is known for optoelectronic transceivers to be connected to an optical network via optical plug connectors. In particular, a small type of so-called small-form-factor (SFF) transceiver is known, which is arranged on a printed circuit board. Infrared light is injected into and output from the transceiver via an adapter which is arranged on the housing of the transceiver and has a plug socket for an optical connector.

A transceiver of that type is illustrated in FIG. 3. The transceiver 1 is disposed in a rectangular housing 11 and it can be plugged into a non-illustrated printed circuit board via pins 12. The transceiver 1 has conventional optoelectronic transducers, such as a FP Laser or VCSEL laser, and a photodiode. Infrared light is injected and output between the transceiver 1 and the optical network via an adapter 2, which is arranged on an opening formed on the front face of the housing 11 of the transceiver 1. The adapter 2 has an opening 21 for holding an optical connector, so that an optical conductor can be connected to the transceiver 1. The plug connection is thereby configured similarly to an RJ-45 plug connection.

For electromagnetic shielding against interference emissions, the adapter 2 has a surrounding shielding plate 3, which is aligned with the housing 11 of the transceiver 1 and is optionally connected to it. For grounding, the shielding plate 3 is electrically connected via contact springs 31 to a non-illustrated metallic structure, for example the front panel of the housing which contains the board with the transceiver module 1 and further components.

In order to form the contact springs 31, cutouts 32 are stamped in the shielding plate 3, resulting in slotted structures in the shielding plate 3. The slotted structures reduce the shielding effect of the shielding plate disadvantageously, as undesirable electromagnetic waves are output. This is based on physical principles, as are used in an analogous manner in waveguide technology for coupling waveguide structures through holes and slots.

An SFF transceiver as shown in FIG. 3 is manufactured by Infineon Technologies AG of Germany and is commercially available under the part number V23818-N15-L17.

SUMMARY OF THE INVENTION

It is accordingly an object of the invention to provide a shielding plate, in particular for optoelectronic transceivers, which overcomes the above-mentioned disadvantages of the heretofore-known devices and methods of this general type and which effectively suppresses interference emissions in the form of electromagnetic waves and, in this context, prevents electromagnetic waves from being output and emitted.

With the foregoing and other objects in view there is provided, in accordance with the invention, a shielding plate, in particular a shielding plate for an optoelectronic transceiver component. The shielding plate comprises:

a hollow body formed as a casing with an end face; and
a plurality of contact springs formed as projections on said end face of said hollow body and bent back onto said hollow body.

In other words, the shielding plate according to the invention is distinguished by the fact that the contact springs are formed by projections which are arranged on the end face of the hollow body and are bent back onto the hollow body. Since the contact springs are linked to the hollow body on the end face, the invention allows the hollow body to be designed as an essentially continuous part which has no cutouts, slots etc., or only a limited number of cutouts, slots etc. This effectively prevents the outputting of electromagnetic waves and provides improved shielding.

The solution according to the invention provides the shielding plate with a chimney-like structure which does not allow any electromagnetic waves to be output through cutouts in the surface of the shielding plate and provides effective shielding against interference emissions.

It will be understood that, in the preferred refinement of the invention, the hollow body of the shielding plate is essentially in the form of a continuous part which has no cutouts, slots etc. However, the invention is also suitable for hollow bodies which also have slots or other cutouts, in which case the number of cutouts is at least reduced by the invention.

It will also be understood that, for the purposes of the invention, the term shielding plate means any desired shielding element which is distinguished by high conductivity both for direct current and for frequencies in the range up to 10 GHz, and which is thus suitable for use as a shielding element. As a rule, the shielding plate will be composed of a highly conductive sheet-metal material. However, other materials are also feasible.

The hollow body and the projections which form the contact springs are preferably designed integrally, that is to say as one part. This allows the shielding plate to be manufactured easily from one part.

Furthermore, the projections which form the contact springs are preferably in the form of comb-like, partial extensions of the cut-open hollow body. In consequence, hollow bodies and projections can be manufactured in a simple manner by stamping. Once a planar sheet-metal part which forms the hollow body and the projections has been stamped, the hollow body is bent to the desired hollow body shape and the comb-like projections are bent through 180° in the direction of the outer surface of the hollow body, thus producing the desired contact springs without the hollow body having any cutouts or slots.

The bent-back contact springs preferably touch the outer surface of the hollow body in a sprung manner in a region of the hollow body which faces away from the end face that is provided with the contact springs. This is, in particular, that region of the hollow body which is adjacent to the housing of a transceiver which is optionally connected to the hollow body or shielding plate respectively. Such a contact spring link advantageously results in a low-value contact resistance to the housing which holds the transceiver.

In accordance with an added feature of the invention, the hollow body has a web on one of its end faces, which web divides the opening which is formed through the hollow body on this end face. For symmetry reasons, the web is preferably arranged centrally in the opening in the hollow body. The use of a web further improves the chimney-like structure or shielding structure on the shielding plate, and thus the shielding for electromagnetic waves. In particular, the web reduces the outputting of electromagnetic waves through the opening in the hollow body.

The hollow body of the shielding plate is preferably in the form of a casing of a cuboid, that is to say it extends in a corresponding manner to the four longitudinal boundary surfaces of a cuboid. However, other hollow body shapes are feasible, depending on the shape of the region to be shielded. For example, the hollow body can likewise be in the form of a cylindrical casing.

In accordance with a preferred feature of the invention, an inner shielding plate is also arranged inside the shielding plate, makes electrical contact with the inner surface of the hollow body and, for example, shields an optical connector. The inner shielding plate is in this case used firstly to link a metallic LASER flange to the shielding plate and thus to dissipate any interference potentials that occur to the shielding plate. Secondly, the inner shielding plate reduces the effective opening of the "chimney" formed by the hollow body, and thus reduces the opening diameter of the nonmetallic aperture for the LASER and receiver flange. This increases the cut-off frequency for any electromagnetic waves which pass through, and thus improves the shielding effect in the relevant frequency band.

The contact springs on the shielding plate are preferably not connected directly to the inner shielding plate, and the latter is merely coupled to the inner surface of the hollow body or shielding plate. Thus, because of the skin effect and because of propagation time differences, there is a potential difference between the inside and the outside of the hollow body.

As already mentioned, the shielding plate according to the invention is preferably used as a shielding plate of an adapter or of a plug socket which couples an optoelectronic transceiver to an optical conductor or to an optical network. For this situation, on its end face which is provided with the contact springs, the hollow body has a socket for an optical connector and, on its opposite end face, it has means for attaching it to the housing of an optoelectronic transceiver. The shielding plate according to the invention may, however, be used in an entirely different context.

Other features which are considered as characteristic for the invention are set forth in the appended claims.

Although the invention is illustrated and described herein as embodied in a title of the invention: shielding plate, in particular for optoelectronic transceivers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
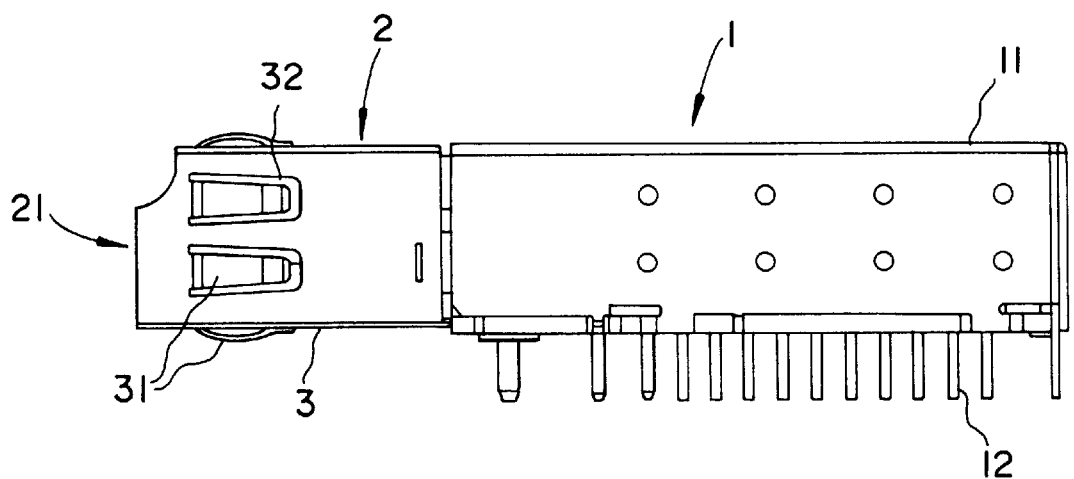
FIG. 3 is a transceiver with a plug socket and shielding plate according to the prior art.

Reference is had to the introductory text above in which the differences are explained between the invention and the prior art shielding plate illustrated in FIG. 3.

Figure 1:
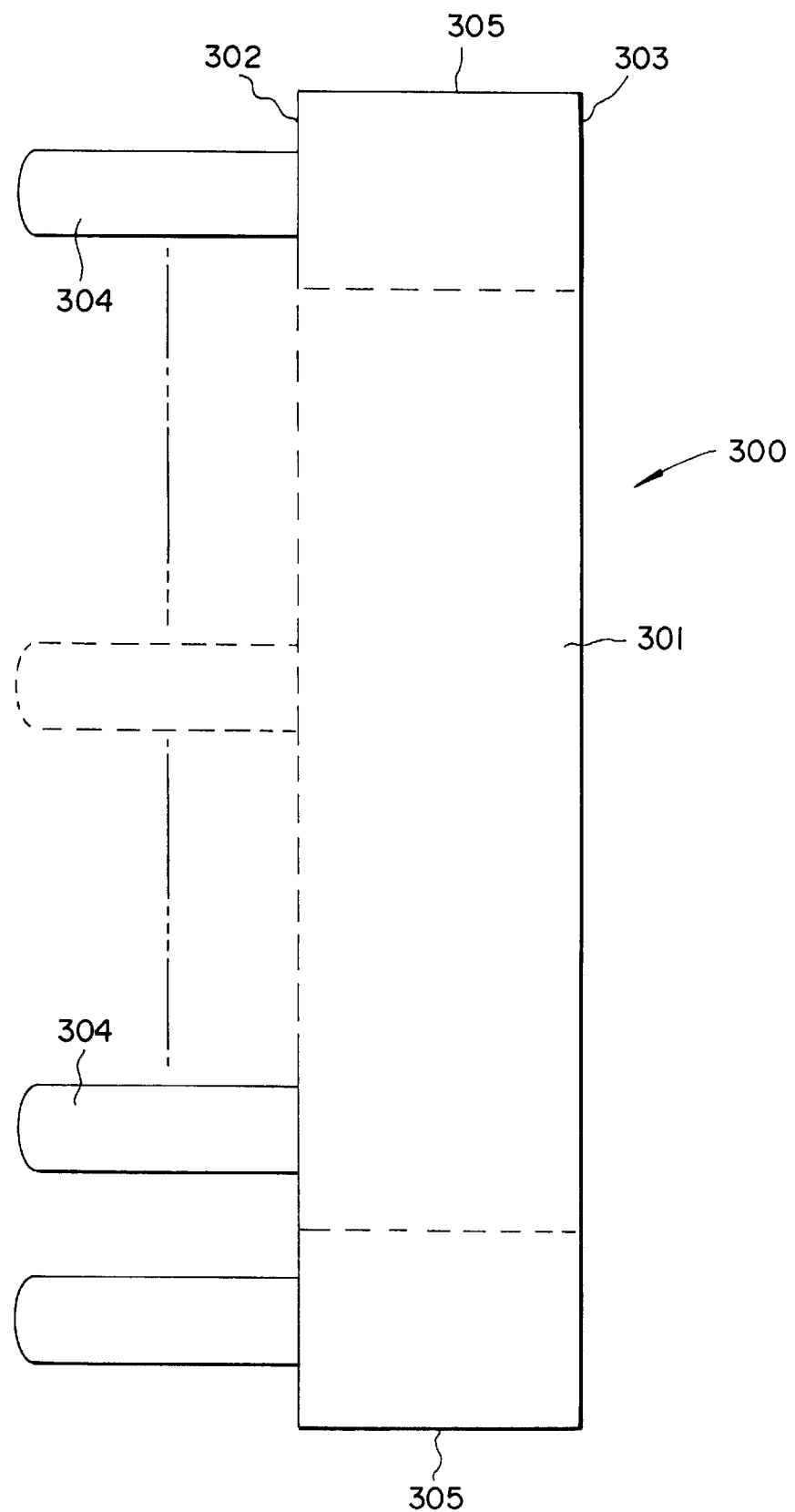
FIG. 1 is a plan view of the cut-open hollow body of a shielding plate with comb-like projections.

Referring now to the figures of the drawing that illustrate the invention in detail and first, particularly, to FIG. 1 thereof, there is shown, schematically, a shielding plate 300 according to the invention in the cut-open, unrolled state. The shielding plate 300 has a hollow body 301 which, in the cut-open state shown in FIG. 1, has a rectangular shape. The hollow body 301 has two end faces 302, 303. Along the end face 302, projections 304 are connected to the hollow body 301 similarly to a comb. The projections 304 have an essentially rectangular shape and represent linear extensions of the hollow body 301. The hollow body 301 and the projections 304 are in this case formed integrally, and are preferably produced as a stamped part.

The sheet metal used for the shielding plate 300 has high conductivity in order to prevent the emission of electromagnetic radiation as reliably as possible.

In order to manufacture the shielding plate 300 according to the invention, the hollow body 301 is folded to form a desired hollow body shape and, in the process, lateral ends 305 or lateral faces 305 of the hollow body 301 are connected to one another. The shielding plate 300 in this case preferably has a cuboid shape, with the hollow body 301 forming the four longitudinal boundary surfaces of a cuboid by appropriate folding. The projections 304 are bent 180° to the rear in order to produce contact springs, with the contact springs being in the form of leaf springs.

Figure 2:
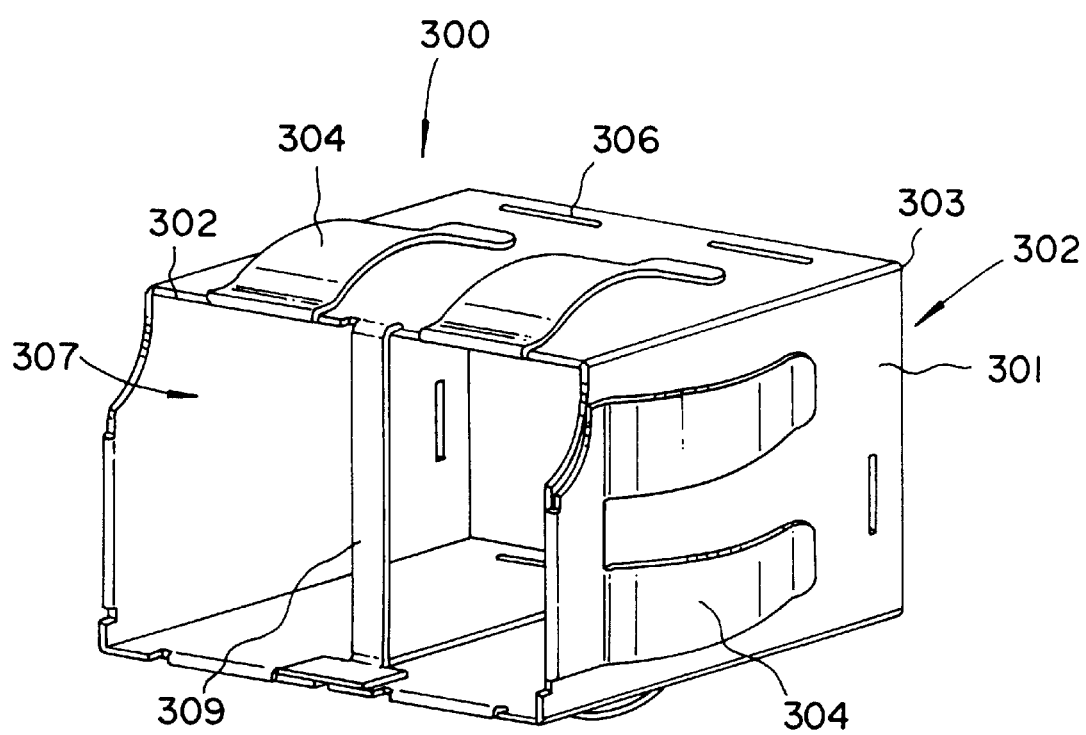
FIG. 2 is a perspective view of a shielding plate according to the invention.

FIG. 2 shows a shielding plate 300 folded in this way. The hollow body 301 forms a surrounding housing which has an opening 307, 308 on each of the two end faces 302, 303. In the preferred application of the shielding plate 300, the housing of an optoelectronic transceiver, such as the transceiver 1 shown in FIG. 3, is connected to the rear opening 308. In order to attach the shielding plate to the transceiver housing, grooves 306 are formed in the hollow body Corresponding tabs or projections on the transceiver housing can latch into the grooves 306.

On the other hand, the front opening 307 is used for connection of an optical connector, with a conventional plug socket (not illustrated) for an optical connector being arranged for this purpose inside the shielding plate 300. The plug socket is in this case surrounded by a non-illustrated inner shielding plate which, in one embodiment, makes an electrical contact with the inner surface of the hollow body 301. In contrast, the contact springs 304 do not themselves make direct contact with the inner shielding plate, since there is a potential difference, which is caused by the skin effect and delay time differences, between the inside and the outside of the shielding plate 301.

The contact springs 304 which rest against the end face 302 of the hollow body 301 are bent back in the direction of the hollow body 301. They are domed slightly outward in a central region and, touch the shielding plate at their end in a sprung manner. The contact springs 304 are in contact with a non-illustrated sheet-metal wall or some other metallic structure which, for example, forms the front panel of a housing. A cutout is formed in the sheet-metal wall or other metallic structure, through which the shielding plate 300 can be pushed, with the contact springs 304 making an electrical contact, in a sprung manner, with the sheet-metal wall. The sheet-metal wall short-circuits the shielding plate and ensures that the shielding plate is at a fixed potential.

The chimney-like structure of the shielding plate 300 prevents the formation of so-called bottlenecks which occur with a shielding plate having cutouts. A bottleneck is, for example, a thin web between two slots, which limits the current and represents an inductance for high frequencies, thus disadvantageously producing increased emitted radiation.

The contact springs 304 touch the shielding plate 300, in its rear part, with a reliable electrical contact being produced. This results in a low-value contact resistance to the housing of a transceiver connected to it.

A web 309 divides the opening 307 centrally in the front opening 307 of the shielding plate 300. The web 309 improves this chimney-like structure and, since it results in the opening diameter being reduced in size, it further reduces any output of electromagnetic waves.

The embodiments of the invention are not limited to the exemplary embodiment described above. The only essential feature to the invention is that, in a shielding element, the contact springs are formed by projections which are arranged on the end faces of the hollow body and are bent back onto the hollow body.

We claim:

1. A shielding plate, comprising:

a hollow body formed as a casing with a continuous outer wall surface and an end face; and a plurality of contact springs formed as projections on said end face of said hollow body and having free ends bent back through substantially 180° onto said outer wall surface of said hollow body;

said free ends of said plurality of contact springs contacting said outer wall surface of said hollow body and forming an electrical contact of low resistance between said plurality of contact springs and said hollow body.

2. The shielding plate according to claim 1, wherein said projections are formed integrally with said hollow body.

3. The shielding plate according to claim 1, wherein said projections represent a comb-like, partial extension of the cut-open hollow body.

4. The shielding plate according to claim 1, wherein said projections have a substantially rectangular shape.

5. The shielding plate according to claim 1, wherein said contact springs touch said hollow body in a sprung manner, on a part of said hollow body facing away from said end face formed with said contact springs.

6. The shielding plate according to claim 1, which further comprises a web formed on one of said end faces of said hollow body and dividing an opening formed through said hollow body.

7. The shielding plate according to claim 6, wherein said web is disposed centrally in the opening in said hollow body.

8. The shielding plate according to claim 1, wherein said hollow body is a cuboid casing.

9. The shielding plate according to claim 1, wherein said hollow body is a cylindrical casing.

10. The shielding plate according to claim 1, which comprises an inner shielding plate disposed inside a shielding plate of said hollow body and making electrical contact with an inner surface of said hollow body.

11. The shielding plate according to claim 1, wherein said end face of said hollow body is configured to hold an optical connector.

12. The shielding plate according to claim 1, wherein said hollow body is formed with a further face opposite said end face and with means at said further face for attaching a housing of an optoelectronic transceiver.

13. In combination with an optoelectronic transceiver, a shielding plate according to claim 1.

14. The shielding plate according to claim 1, wherein said hollow body has an unbroken surface.

* * * * *

UNITED STATES PATENT AND TRADEMARK OFFICE
CERTIFICATE OF CORRECTION

PATENT NO.   : 6,540,555 B1                                             Page 1 of 1
DATED        : April 1, 2003
INVENTOR(S)  : Mario Festag et al.

It is certified that error appears in the above-identified patent and that said Letters Patent is hereby corrected as shown below:

<u>Title page,</u>
Item [22], should read as follows -- Oct. 27, 2000 --

Signed and Sealed this

Seventeenth Day of June, 2003

JAMES E. ROGAN
*Director of the United States Patent and Trademark Office*